United States Patent
Bailey et al.

[11] Patent Number: 6,040,742
[45] Date of Patent: Mar. 21, 2000

[54] CHARGE-PUMP PHASE-LOCKED LOOP WITH DC CURRENT SOURCE

[75] Inventors: James A. Bailey, Snowflake, Ariz.; William B. Wilson, Macungie, Pa.

[73] Assignee: Lucent Technologies Inc., Murray Hill, N.J.

[21] Appl. No.: 09/144,913

[22] Filed: Sep. 1, 1998

Related U.S. Application Data

[60] Provisional application No. 60/057,875, Sep. 2, 1997.

[51] Int. Cl.[7] .............................. H03L 7/07; H03L 7/089; H03L 7/093
[52] U.S. Cl. ................................... 331/2; 331/17; 331/25; 327/157
[58] Field of Search .................................. 331/17, 25, 2; 327/148, 157

[56] References Cited

U.S. PATENT DOCUMENTS

| | | | |
|---|---|---|---|
| 5,166,641 | 11/1992 | Davis et al. | 331/17 |
| 5,631,587 | 5/1997 | Co et al. | 331/25 |
| 5,734,301 | 3/1998 | Lee et al. | 331/17 |

OTHER PUBLICATIONS

"A Self Correcting Clock Recovery Circuit," by Charles R. Hogge, Jr., IEEE Journal of Lightwave Technology, vol. LT-3, Dec. 1985, pp. 1312–1314.

*Primary Examiner*—Siegfried H. Grimm

[57] ABSTRACT

A phase-locked loop (PLL) has a phase detector (PD), a charge pump, a loop filter, and a voltage-controlled oscillator (VCO). The PD generates DOWN pulses based on differences in phase between an input signal and a feedback signal. The charge pump has an UP current source that generates a DC UP current and a DOWN current source that generates a DOWN current based on the DOWN pulses received from the phase detector. The charge pump generates a charge-pump current based on the DC UP current and the DOWN current. The loop filter receives the charge-pump current and generates a loop-filter voltage based on a net accumulation of charge from the charge-pump current. The VCO receives the loop-filter voltage and generates an output signal whose frequency is based on the loop-filter voltage, wherein the feedback signal is generated from the output signal. By using a DC UP current source, the PLLs of the present invention are able to operate at higher frequencies than conventional charge-pump PLLs, since the UP current source in the charge pump of a conventional PLL responds less quickly to PD pulses than does a conventional DOWN current source, due to mobility differences between holes and electrons, e.g., in conventional CMOS circuitry.

12 Claims, 5 Drawing Sheets

CHARGE-PUMP PHASE-LOCKED LOOP WITH DC CURRENT SOURCE

CROSS-REFERENCE TO RELATED APPLICATIONS

This application claims the benefit of the filing date of U.S. provisional application No. 60/057,875, filed on Sep. 2, 1997 as attorney docket no. Bailey 2-6-18-4.

BACKGROUND OF THE INVENTION

1. Field of the Invention

The present invention relates to electronics, and, in particular, to phase-locked loops.

2. Description of the Related Art

A phase-locked loop (PLL) is a circuit that generates a periodic output signal that has a constant phase relationship with respect to a periodic input signal. PLLs are widely used in many types of measurement, microprocessor, and communication applications. One type of phase-locked loop is the charge-pump PLL, which is described in Floyd M. Gardner, "Charge-Pump Phase-Lock Loops" *IEEE Trans. Commun.*, vol. COM-28, pp. 1849–1858, November 1980, the teachings of which are incorporated herein by reference.

Figure 1:
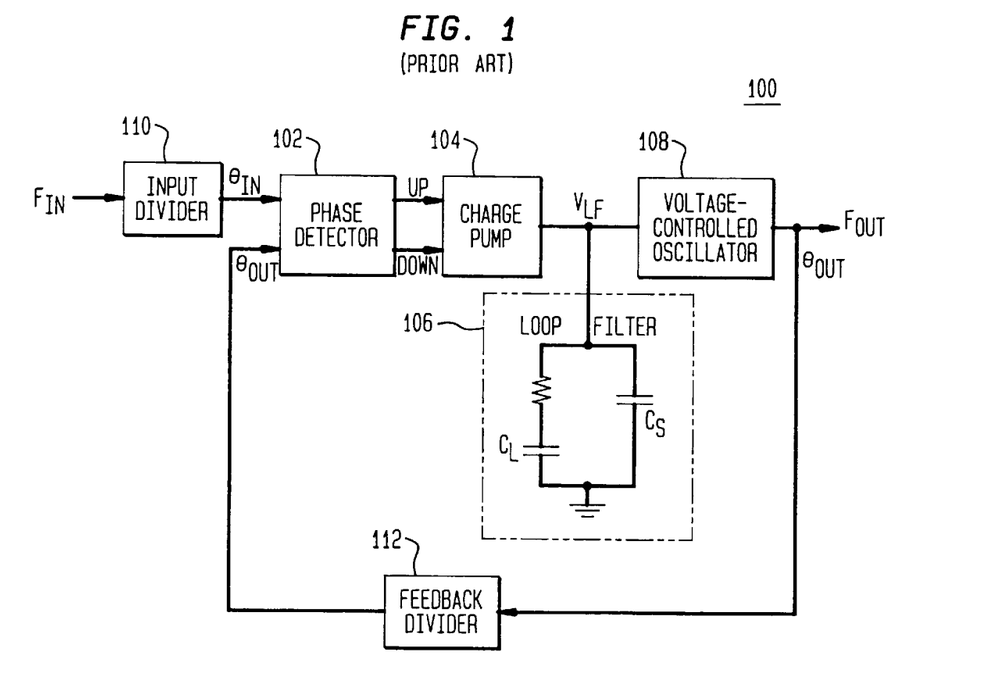
FIG. 1 shows a block diagram of a conventional charge-pump phase-locked loop.

FIG. 1 shows a block diagram of a conventional charge-pump phase-locked loop 100. Phase detector (PD) 102 compares the phase $\theta_{IN}$ of the input signal $F_{IN}$ to the phase $\theta_{OUT}$ of the feedback signal $F_{OUT}$ and generates an error signal: either an UP signal U (when $\theta_{IN}$ leads $\theta_{OUT}$) or a DOWN signal D (when $\theta^{OUT}$ leads $\theta_{IN}$), where the width of the error signal pulse indicates the magnitude of the difference between $\theta_{IN}$ and $\theta_{OUT}$.

Charge pump 104 generates an amount of charge equivalent to the error signal (either U or D) from PD 102. Depending on whether the error signal was an UP signal or a DOWN signal, the charge is either added to or subtracted from the capacitors in loop filter 106. For purposes of this explanation, loop filter 106 has a relatively simple design, consisting of a capacitor $C_S$ in parallel with the series combination of a resistor R and a relatively large capacitor $C_L$. As such, loop filter 106 operates as an integrator that accumulates the net charge from charge pump 104. Other, more-sophisticated loop filters are of course also possible. The resulting loop-filter voltage $V_{LF}$ is applied to voltage-controlled oscillator (VCO) 108. A voltage-controlled oscillator is a device that generates a periodic output signal ($F_{OUT}$ in FIG. 1), whose frequency is a function of the VCO input voltage ($V_{LF}$ in FIG. 1). In addition to being the output signal from PLL 100, the VCO output signal $F_{OUT}$ is used as the feedback signal for the closed-loop PLL circuit.

Optional input and feedback dividers 110 and 112 may be are placed in the input and feedback paths, respectively, if the frequency of the output signal $F_{OUT}$ is to be either a fraction or a multiple of the frequency of the input signal $F_{IN}$. If not, the input and feedback dividers can both be considered to apply factors of 1 to the input and feedback signals, respectively.

Due to the effect of the feedback path in PLL 100, the steady-state output signal $F_{OUT}$ will have a fixed phase relationship with respect to the input signal $F_{IN}$. Under ideal conditions, unless some phase offset is purposely added, the phases of the input and output signals in PLL 100 will be synchronized with zero offset. In reality, however, a phase-locked loop, such as PLL 100 of FIG. 1, will operate with some non-zero phase offset. One cause for such phase offset is a mismatch between the UP and DOWN currents generated by charge pump 104. This may be due to inherent imbalances within either the phase detector or the charge pump, or both. In the presence of an UP/DOWN current mismatch, the PLL feedback loop has to put a phase offset between the two inputs to PD 102 to generate UP/DOWN pulses that balance the mismatch in order to achieve a phase-locked condition. Under constant operating conditions (e.g., temperature and clock cycle), this particular type of phase offset is itself typically constant and is therefore referred to as static phase offset.

Since PLLs are widely used in clock distribution applications, avoidance of a phase difference between the input reference system clock and the PLL-generated output clock is desired. Any phase difference degrades system performance and can be catastrophic, especially at higher frequencies, where the period of the PLL's input and output signals are smaller, leaving very limited leeway between edges of the input and output signals.

Furthermore, a charge-pump phase-locked loop, such as PLL 100 of FIG. 1, might not be able to operate satisfactorily in high-frequency applications due to differences in the mobility of holes and electrons through the integrated circuitry (e.g., in a generic CMOS technology). In such cases, the charge pump will not be able to generate pump-up currents fast enough in response to the high-speed pulse signals from the phase detector. Possible solutions include using a pull-up resistor in the loop filter to make one integrator lossy or setting a current source in the charge pump open loop. Unfortunately, such solutions would only increase the magnitude of the static phase offset in the PLL.

SUMMARY OF THE INVENTION

The present invention is directed to a scheme for providing a high-speed charge-pump phase-locked loop that can operate at high frequencies. According to this scheme, the charge pump has a DC UP current source and a DOWN current source that is dynamically controlled based on DOWN signals received from the phase detector. By using a DC UP current source in the charge pump, the PLL is able to operate at speeds higher than PLLs having conventional designs, such as PLL 100 of FIG. 1.

In one embodiment, the present invention is an integrated circuit having a phase-locked loop, the PLL comprising (a) a first phase detector, configured to receive an input signal and a feedback signal and to generate DOWN pulses based on differences in phase between the input and feedback signals; (b) a first charge pump, configured to receive the DOWN pulses from the first phase detector and comprising (1) a first UP current source configured to generate a first DC UP current; and (2) a first DOWN current source, configured to generate a first DOWN current based on the DOWN pulses from the first phase detector, wherein the first charge pump generates a first charge-pump current based on the first DC UP current and the first DOWN current; (c) a loop filter, configured to receive the first charge-pump current and to generate a loop-filter voltage based on a net accumulation of charge from the first charge-pump current; and (d) a voltage-controlled oscillator, configured to receive the loop-filter voltage and to generate an output signal whose frequency is based on the loop-filter voltage, wherein the feedback signal is generated from the output signal.

In an alternative embodiment, the PLL has a master circuit and a slave circuit, where the master circuit generates a control voltage used to control the charge pump in the slave circuit. The master circuit has a phase detector and a charge pump that are purposely similar to the PD and charge pump in the slave circuit. In particular, the charge pump in each of the master and slave circuits has a DC UP current source and a DOWN current source that is dynamically controlled based on DOWN signals received from the corresponding phase detector. By applying inputs to the master circuit having zero phase offset, the master circuit simulates the mismatch between devices in the slave circuit. The resulting control voltage is applied to the charge pump in the slave circuit in such a way as to compensate for static phase offset in the slave circuit.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 2:
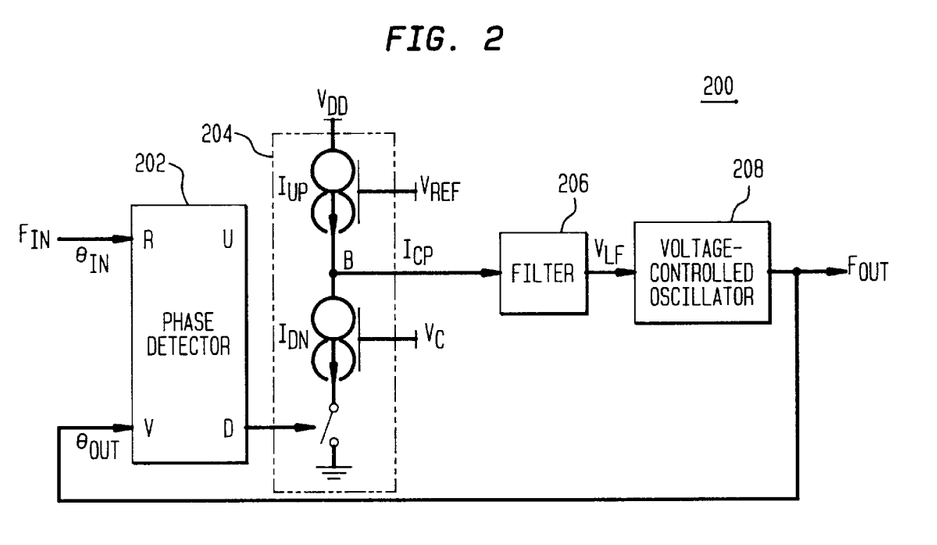
FIGS. 2–3 show block diagrams of phase-locked loops, according to different embodiments of the present invention.

FIG. 2 shows a block diagram of phase-locked loop 200, according to one embodiment of the present invention. PLL 200 comprises phase detector 202, charge pump 204, filter 206, and voltage-controlled oscillator 208, where PD 202, filter 206, and VCO 208 may be similar to the corresponding components in PLL 100 of FIG. 1. Unlike charge pump 104 of PLL 100, however, charge pump 204 of PLL 200 has an UP current source that generates a DC UP current $I_{UP}$ and a DOWN current source that generates a DOWN current $I_{DN}$ that is dynamically controlled based on DOWN signals from PD 202.

Similar to conventional charge-pump PLLs, the DOWN current source in charge pump 204 is turned on and off based on the DOWN pulse signals received from PD 202, where the magnitude of the DOWN current $I_{DN}$ is controlled by a control voltage $V_C$ that is applied to the gate of the DOWN current source. According to the present invention, the UP current source in charge pump 204 is always on, with the magnitude of the UP current $I_{UP}$ being controlled by a DC reference voltage $V_{REF}$ applied to the gate of the UP current source. Control voltages for down and up current sources will be described in further detail later in this specification with respect to PLL 300 of FIG. 3.

In operation, phase detector 202 receives an input signal $F_{IN}$ (e.g., the data input for PLL 200) and a feedback signal $F_{OUT}$, compares the phase $\theta^{IN}$ of the input signal $F_{IN}$ to the phase $\theta_{OUT}$ of the output signal $F_{OUT}$, and generates an UP pulse signal and a DOWN pulse signal, where the difference in duration between the two pulses is a function of the phase difference of the two inputs to PD 202. In reality, even when there is zero phase offset, PD 202 always generates both an UP pulse and a DOWN pulse, with the difference in duration between the two pulses being a function of the phase difference of the two inputs to PD 202.

According to the present invention, only the DOWN pulse signal is applied to charge pump 204; the UP pulse signal is ignored. Depending on the implementation, PD 202 may be designed to generate only DOWN pulses. In any case, when charge pump 204 receives a DOWN pulse, the DOWN current source is turned on for the duration of the DOWN pulse and a negative current is applied to node B, thereby removing positive charge from filter 206. Meanwhile, the UP current source, which is always on, is constantly applying a positive current to node B, thereby constantly applying positive charge to filter 206. As a result, charge pump 204 generates a net current $I_{CP}$ that is either positive or negative, depending on the magnitude of the DC UP current $I_{UP}$, the magnitude of the DOWN current $I_{DN}$, and the frequency and durations of the DOWN pulses. Since PD 202 generates a DOWN pulse with some non-zero width in every operating cycle, even when there is zero phase offset between the two inputs to PD 202, the UP current source will always generate a non-zero DC UP current.

The UP and DOWN current sources in charge pump 204 may be implemented using any suitable devices. For example, using CMOS technology, the UP current source can be implemented using p-channel FETs, while the DOWN current source can be implemented using n-channel FETs. In alternative implementations, the current sources can be implemented using bipolar transistor technology.

Like filter 106 of FIG. 1, loop filter 206 accumulates the net current charges generated by charge pump 204 and generates a loop-filter voltage $V_{LF}$ that controls the frequency of the output signal $F_{OUT}$ generated by VCO 208, which, in this implementation, is also the feedback signal applied to PD 202.

Due to differences in mobility between holes and electrons in typical CMOS circuitry, the DOWN current source in the charge pump of a conventional PLL, such as PLL 100 of FIG. 1, can respond quicker to phase detector pulses than can a conventional charge-pump UP current source. According to the present invention, by making the UP current source in the charge pump of a PLL a DC current source, the charge pump becomes independent of the UP signals generated by the PD. As a result, the PLLs of the present invention can be operated at higher frequencies than conventional charge-pump PLLs, such as PLL 100 of FIG. 1.

Figure 3:
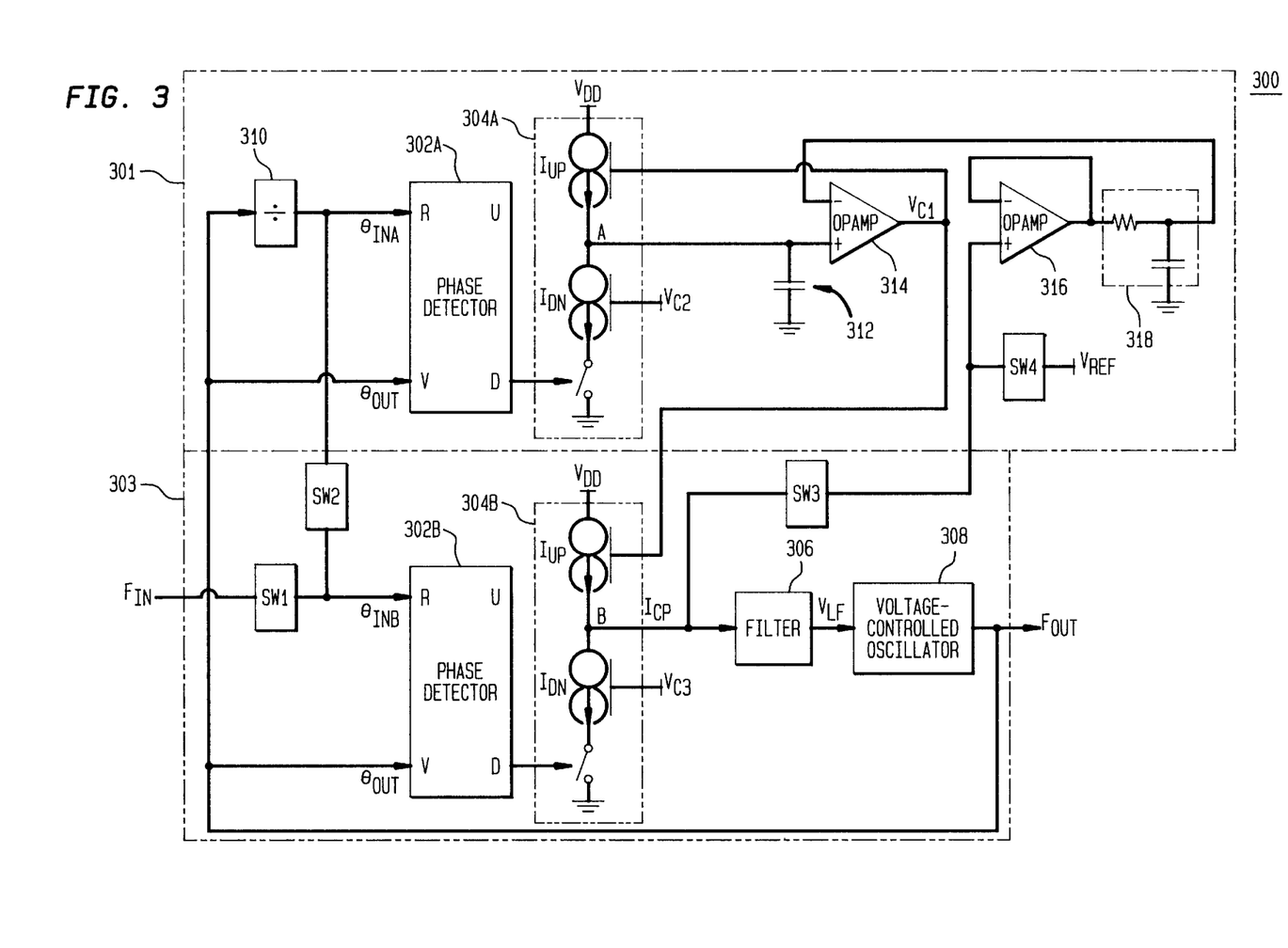

FIG. 3 shows a block diagram of phase-locked loop 300, according to an alternative embodiment of the present invention. PLL 300 has a master circuit 301 and a slave circuit 303. Slave circuit 303 comprises phase detector 302B, charge pump 304B, filter 306, and voltage-controlled oscillator 308. These components are similar to PD 202, charge pump 204, filter 206, and VCO 208, respectively, of FIG. 2.

Master circuit 301 comprises reference generator 310, phase detector 302A, charge pump 304A, capacitor 312, operational amplifiers (op-amps) 314 and 316, and low-pass filter (LPF) 318, which, in this embodiment, consists of a resistor and a capacitor. Master circuit 301 is purposely implemented with some of its components as identical as possible to corresponding components in slave circuit 303. In particular, PD 302A of master circuit 301 is ideally the same as PD 302B of slave circuit 303, and the devices used to implement charge pump 304A of master circuit 301 are ideally the same as those used to implement charge pump 304B of slave circuit 303.

During steady-state operations (e.g., data recovery), switches SW1 and SW3 are closed and switches SW2 and SW4 are opened. (During start-up operations, switches SW1 and SW3 are opened and switches SW2 and SW4 are closed. Start-up operations are described in further detail later in this specification.) During steady-state operations, the signals input to master PD 302A are different from those input to slave PD 302B. The two inputs to master PD 302A are both based on the same signal (in this implementation, the feedback signal $F_{OUT}$), with the reference input (R) to master PD 302A being generated by reference generator 310, which in this implementation is a divider. Those skilled in the art will understand that reference generator 310 is implemented as a divider to ensure that the reference input R to master PD 302A is NRZ (no return to zero) data for those phase detectors expecting NRZ data. Other phase detectors that expect different (i.e., non-NRZ) reference inputs may require a different reference generator. It will also be understood that the value of the divider in reference generator 310 (e.g., 2, 4, etc.) is chosen to compensate for the data transition density in the input signal $F_{IN}$, where a divider value of 2 generates NRZ data with a 100% transition density.

By generating both input signals to master PD 302A from the same signal (in this case, feedback signal $F_{OUT}$, although other signals could be used, such as an externally generated clock signal), the two input signals are guaranteed to be in phase (i.e., zero phase offset between them) (assuming that no phase delay is introduced by reference generator 310). This zero phase offset condition ensures that any net charge accumulating on capacitor 312 based on currents generated by master charge pump 304A will be due solely to mismatches within master PD 302A and charge pump 304A. Since those components are ideally the same as the corresponding components in slave circuit 303, the mismatch in master circuit 301 should mirror the mismatch in slave circuit 303.

As shown in FIG. 3, any net charges accumulating on capacitor 312 will cause op-amp 314 to generate a control voltage $V_{C1}$ which is applied to the gate of the UP current source in master charge pump 304A and to the gate of the UP current source in slave charge pump 304B. As a result, the magnitudes of the DC UP currents $I_{UP}$ in both master charge pump 304A and slave charge pump 304B are controlled based on the control voltage $V_{C1}$ generated by master circuit 301. This substantially cancels any static phase offset in slave circuit 303.

Figure 4A:
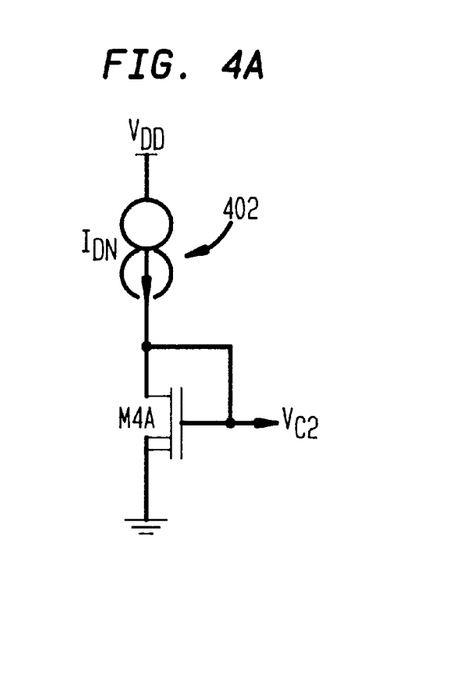
FIGS. 4A and 4B show the circuitry used to generate the control voltages $V_{C2}$ and $V_{C3}$ that are applied to the gates of the DOWN current sources in the master and slave charge pumps of the PLL of FIG. 3 to control the magnitudes of the master and slave DOWN currents $I_{DN}$, respectively.
Figure 4B:
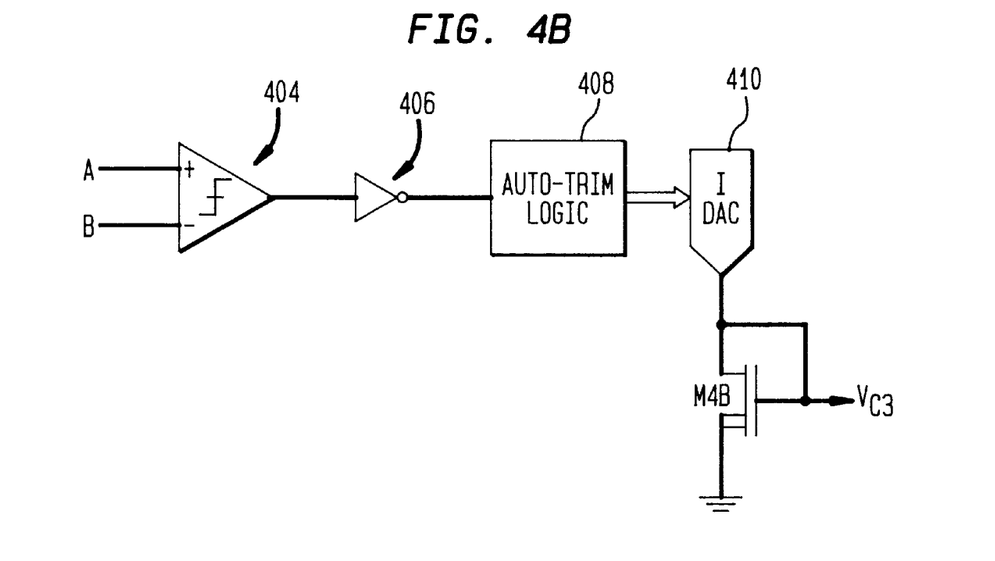

FIGS. 4A and 4B show the circuitry used to generate the control voltages $V_{C2}$ and $V_{C3}$ that are applied to the gates of the DOWN current sources in master charge pump 304A and slave charge pump 304B, respectively, to control the magnitudes of the master and slave DOWN currents $I_{DN}$. As shown in FIG. 4A, the control voltage $V_{C2}$ is generated using a DC current source 402 and a transistor M4A configured with the DOWN current source in master charge pump 304A of FIG. 3 to operate as a current mirror, wherein the current through current source 402 is mirrored in the master DOWN current source. The feedback loop incorporating op-amp 314 will adjust the value of control voltage $V_{C1}$ so that the value of the UP current $I_{UP}$ in master charge pump 304A is equal to the average value of the DOWN current $I_{DN}$, where the average value is set by the control voltage $V_{C2}$ and the frequency and durations of the DOWN pulses.

As shown in FIG. 4B, the control voltage $V_{C3}$ is generated by a digitally controlled current source (IDAC) 410 and a transistor M4B configured with the DOWN current source in slave charge pump 304B of FIG. 3 to operate as a current mirror, where the current generated by IDAC 410 is mirrored in the slave DOWN current source. IDAC 410 is controlled by a multi-bit digital input value generated by auto-trim logic 408, which in turn is driven by signals generated by voltage comparator 404 and buffered by inverting buffer 406. Voltage comparator 404, which is preferably a comparator with some hysteresis such as a Schmitt trigger, compares the voltages at nodes A and B in FIG. 3 and generates a binary output indicating which voltage is higher.

Auto-trim logic 408 preferably performs a binary linear search similar to that implemented by the auto-trim logic described in U.S. patent application Ser. No. 09/008,798, filed on Jan. 20, 1998 as Attorney Docket No. Moon 1-5, now U.S. Pat. No. 5,942,949, the teachings of which are incorporated herein by reference. The IDAC auto-trim operations are run during the start-up process when switches SW1 and SW3 are open and switches SW2 and SW4 are closed. The closing of switch SW2 ensures that the DOWN outputs of phase detectors 302A and 302B are substantially the same. The purpose of switch SW4 will be described later in this specification. Auto-trim logic 408 adjusts the current supplied by IDAC 410 by comparing the voltages of nodes A and B for each setting of IDAC 410 until the desired setting is found. During steady-state operations, the magnitudes of the DOWN currents in the master and slave charge pumps are ideally the same.

If master PD 302A and charge pump 304A operate substantially identical to slave PD 302B and charge pump 304B, then the mismatch in master circuit 301 should be substantially identical to the mismatch in slave circuit 303. A mismatch in master circuit 301 that results in a net positive current being generated by master charge pump 304A will result in a net positive charge being stored in capacitor 312 and an increase in control voltage $V_{C1}$. This increase in control voltage $V_{C1}$, as applied to the gates of the UP current sources in both master charge pump 304A and slave charge pump 304B, will decrease the magnitudes of the UP currents $I_{UP}$, thereby tending to compensate for the positive-current mismatch.

Analogously, a mismatch in master circuit 301 that results in a net negative current being generated by master charge pump 304A will result in a net negative charge being stored in capacitor 312 and a decrease in control voltage $V_{C1}$. This decrease in control voltage $V_{C1}$, as applied to the gates of the UP current sources in both master charge pump 304A and slave charge pump 304B, will increase the magnitudes of the UP currents $I_{DN}$, thereby tending to compensate for the negative-current mismatch.

In this way, controlling the magnitudes of the UP currents $I_{UP}$ decreases the magnitude of net charge that would otherwise accumulate on the capacitors in filter 306 due to mismatches within slave PD 302B and charge pump 304B. Assuming complete negation of such charge build-up in filter 306, the phase $\theta_{OUT}$ of the feedback signal $F_{OUT}$ would be able to match the phase $\theta_{INB}$ of the input signal $F_{IN}$, thus achieving a phase-locked condition with zero static phase offset. In this way, the present invention provides a scheme for compensating for—and possible canceling—static phase offset in PLLs.

Although the present invention has been described in the context of charge pumps having UP currents with fixed magnitudes and DOWN currents with controlled magnitudes, it will be understood that the present invention can be implemented using alternative schemes, such as charge pumps having fixed DOWN currents and controlled UP currents or charge pumps in which both UP and DOWN currents are controlled.

As mentioned earlier, during start-up operations, switches SW1 and SW3 in FIG. 3 are opened and switches SW2 and SW4 are closed. As a result of such a configuration of switches SW1 and SW2, the same zero-phase-difference input signals will be applied to both master PD 302A and slave PD 302B. By the same token, as a result of such a configuration of switches SW3 and SW4, the reference voltage $V_{REF}$ will be applied to the positive input of op-amp 316, rather than the loop-filter voltage $V_{LF}$, where the reference voltage $V_{REF}$ is preferably about half the magnitude of the circuit bias voltage $V_{DD}$.

During IDAC auto-trim operations, switch SW3 is open and switch SW4 is closed. This forces the feedback loop incorporating op-amp 314 and the UP current $I_{UP}$ in master charge pump 304A to drive the voltage at node A to be nominally equal to the reference voltage $V_{REF}$. During steady-state operations, switch SW4 is open and switch SW3 is closed. This causes the output of unity-gain-configured op-amp 316 to force a copy of the voltage at node B into filter 318. Filter 318 is a low-pass filter (although alternative topologies are possible), whose bandwidth is set substantially below the loop bandwidths of both slave circuit 303 and the feedback loop comprising op-amp 314, master charge pump 304A, the voltage on node A, and capacitor 312.

The application of the output of filter 318 to the negative input of op-amp 314 causes the above-mentioned feedback loop to make the voltage at node A substantially equal to the voltage at node B during steady-state operations. This means that the value of the UP current $I_{UP}$ in slave charge pump 304B will be adjusted up or down as a result of changes in the voltage on node B, thereby affecting the ability of charge pumps 304A and 304B to provide the desired currents. As the voltage at node B increases (with a corresponding increase in the frequency of the output signal $F_{OUT}$), the value of the UP charge-pump current $I_{UP}$ will decrease for a constant value of the control voltage $V_{C1}$, assuming that slave UP current source is implemented with a standard PMOS device. A similar effect occurs for the value of the DOWN current $I_{DN}$ as the voltage on node B moves close to ground. By using op-amp 316 and filter 318 to force node A to mirror node B, the control voltage $V_{C1}$ will be adjusted so that the UP current $I_{UP}$ in both charge pumps 304A and 304B is nominally equal to the average value of the DOWN current $I_{DN}$ in slave charge pump 304B.

Figure 5:
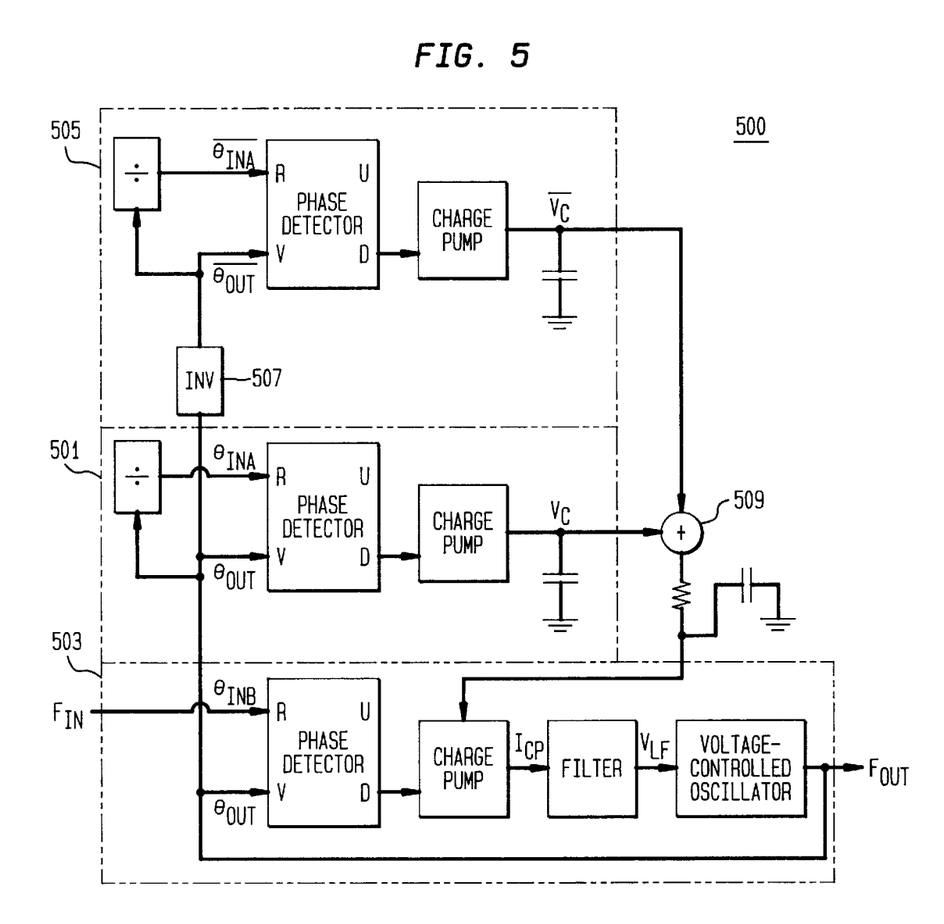
FIG. 5 shows a block diagram of a phase-locked loop, according to another embodiment of the present invention.

FIG. 5 shows a block diagram of phase-locked loop 500, according to another embodiment of the present invention. PLL 500 has two master circuits 501 and 505 and a slave circuit 503. Master circuit 501 and slave circuit 503 are similar to master circuit 301 and slave circuit 303, respectively, of PLL 300 of FIG. 3. Master circuit 505 is similar to master circuit 501, except that it has an inverter 507 that inverts the feedback signal $F_{OUT}$ generated by the VCO of slave circuit 503. In addition, PLL 500 has a summation node 509 which generates the weighted sum (e.g., average) of the two voltages $V_C$ and $\overline{V_C}$ generated by the two master circuits 501 and 505. This weighted sum is used to generate the control voltage applied to the charge pump in slave circuit 503. By generating the control voltage based on the weighted sum of voltages generated based on the feedback signal $F_{OUT}$ and its inverse $\overline{F_{OUT}}$, the static phase offset compensation scheme of PLL 500 accounts for variations in the duty cycle of the signals used to generate the control voltage.

Those skilled in the art will understand that the phase detectors of the present invention may be implemented as phase/frequency detectors. Furthermore, although the present invention has been described in the context of PLLs having a slave circuit and at least one distinct master circuit, those skilled in the art will understand that the present invention can be implemented in embodiments having a single circuit similar to the on-line slave circuit in FIG. 3, where, at different times, the circuit may be switched off-line to operate as an off-line master circuit used to generate signals for compensating for static phase offset when the circuit operates as an on-line slave circuit. Such an implementation would make use of well-known techniques related to the timing of calibrations in D/A and A/D converters.

Those skilled in the art will understand that the term "DC" as used in this specification refers to signals that are either constant over time (i.e., steady state) or change slowly relative to other signals or with changes in environmental conditions, such as temperature and voltage. Thus, the magnitudes of the DC UP currents generated by charge pumps according to the present invention may vary over time, but will do so relatively slowly as compared to the speed of the DOWN pulses that cause the DOWN currents to be turned on and off within those same charge pumps.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a phase-locked loop (PLL), the PLL comprising:
   (a) a first phase detector, configured to receive an input signal and a feedback signal and to generate DOWN pulses based on differences in phase between the input and feedback signals;
   (b) a first charge pump, configured to receive the DOWN pulses from the first phase detector and comprising:
      (1) a first UP current source configured to generate a first DC UP current; and
      (2) a first DOWN current source, configured to generate a first DOWN current based on the DOWN pulses from the first phase detector, wherein the first charge pump generates a first charge-pump current based on the first DC UP current and the first DOWN current;
   (c) a loop filter, configured to receive the first charge-pump current and to generate a loop-filter voltage based on a net accumulation of charge from the first charge-pump current; and
   (d) a voltage-controlled oscillator, configured to receive the loop-filter voltage and to generate an output signal whose frequency is based on the loop-filter voltage, wherein the feedback signal is generated from the output signal.

2. The invention of claim 1, wherein:
   the first phase detector, the first charge pump, the loop filter, and the voltage-controlled oscillator are part of a slave circuit;
   the PLL further comprises a first master circuit configured to the slave circuit, wherein the first master circuit comprises one or more components similar to corresponding components in the slave circuit and the first master circuit is adapted to receive input signals with substantially zero phase offset to generate a control signal representative of mismatch within the components, wherein the control signal is applied to the slave circuit to compensate for static phase offset in the slave circuit.

3. The invention of claim 2, wherein:
   the first master circuit comprises:
      (1) a master phase detector, configured to receive two input signals having substantially zero phase offset and to generate DOWN pulses indicative of any mismatch within the master phase detector; and (2) a master charge pump, configured to receive the DOWN pulses from the master phase detector and to generate a master charge-pump current based on the DOWN pulses and further indicative of any mismatch within the master charge pump, wherein the master charge-pump current is used to generate the control signal applied to the slave circuit.

4. The invention of claim 3, wherein the two input signals to the master phase detector are generated from the feedback signal generated by the slave circuit.

5. The invention of claim 4, wherein the master circuit comprises a reference generator that ensures that the master phase detector receives an appropriate reference input signal.

6. The invention of claim 3, wherein the control signal is applied to the first charge pump to control the magnitude of the first charge-pump current.

7. The invention of claim 3, wherein the master charge pump comprises:

(1) a master UP current source configured to generate a master DC UP current; and (2) a master DOWN current source, configured to generate a master DOWN current based on the DOWN pulses from the master phase detector, wherein the master charge pump generates the master charge-pump current based on the master DC UP current and the master DOWN current.

8. The invention of claim 7, wherein the master charge pump further comprises a capacitor and first and second operational amplifiers (op-amps), each op-amp receiving first and second inputs and generating an output, wherein:

the capacitor is configured to receive the master charge-pump current and to generate the first input to the first op-amp;

the second op-amp is configured to receive the loop-filter voltage from the slave circuit as the first input and the output signal from the second op-amp as the second input;

the first op-amp is configured to receive a signal based on the output signal from the second op-amp as the second input and to generate the control signal applied to the slave circuit.

9. The invention of claim 8, wherein the control signal is applied to control the magnitudes of the UP currents generated by both the first UP current source in the first charge pump in the slave circuit and the master UP current source in the master charge pump in the master circuit.

10. The invention of claim 2, wherein the PLL further comprises a second master circuit, adapted to generate a control signal based on inverted versions of the input signals applied to the first master circuit, wherein the control signals from the first and second master circuits are combined to generate the control signal applied to the slave circuit.

11. The invention of claim 2, wherein the first master circuit and the slave circuit are implemented as a single circuit that operates as the slave circuit when switched on-line and operates as the master circuit when switched off-line.

12. The invention of claim 1, wherein the first UP current source in the first charge pump is configured to generate the first DC UP current independent of any UP pulses generated by the first phase detector.

* * * * *